(12) United States Patent
Tung et al.

(10) Patent No.: US 11,910,595 B2
(45) Date of Patent: Feb. 20, 2024

(54) SEMICONDUCTOR MEMORY DEVICE

(71) Applicant: Fujian Jinhua Integrated Circuit Co., Ltd., Quanzhou (CN)

(72) Inventors: Yu-Cheng Tung, Kaohsiung (TW);
Janbo Zhang, Zhangzhou (CN);
Shih-Han Hung, Kaohsiung (TW);
Li-Wei Feng, Tainan (TW)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 207 days.

(21) Appl. No.: 17/408,510

(22) Filed: Aug. 23, 2021

(65) Prior Publication Data
US 2023/0008188 A1 Jan. 12, 2023

(30) Foreign Application Priority Data

Jul. 6, 2021 (CN) .......................... 202110761611.8
Jul. 6, 2021 (CN) .......................... 202121528256.1

(51) Int. Cl.
*H10B 12/00* (2023.01)
(52) U.S. Cl.
CPC ......... *H10B 12/482* (2023.02); *H10B 12/315* (2023.02); *H10B 12/34* (2023.02)
(58) Field of Classification Search
CPC .... H10B 12/483; H10B 12/34; H10B 12/315; H10B 12/0335
See application file for complete search history.

(56) References Cited

U.S. PATENT DOCUMENTS

| 10,068,907 | B1* | 9/2018 | Tsai | H01L 29/0649 |
|---|---|---|---|---|
| 10,475,794 | B1* | 11/2019 | Wu | H10B 12/485 |
| 10,559,570 | B2* | 2/2020 | Nagai | H10B 12/0335 |
| 2015/0255466 | A1* | 9/2015 | Hwang | H10B 12/50 |
| | | | | 438/586 |
| 2016/0276349 | A1* | 9/2016 | Kwon | H10B 12/482 |
| 2019/0164975 | A1* | 5/2019 | Song | H10B 12/485 |
| 2019/0333918 | A1* | 10/2019 | Kim | H10B 12/31 |
| 2020/0111795 | A1* | 4/2020 | Feng | H10B 12/0335 |
| 2020/0194439 | A1* | 6/2020 | Kim | H01L 29/66553 |
| 2020/0273862 | A1* | 8/2020 | Wu | H10B 12/0335 |
| 2021/0013212 | A1* | 1/2021 | Kim | H10B 12/0335 |
| 2021/0210493 | A1* | 7/2021 | Kim | H01L 21/764 |
| 2021/0398984 | A1* | 12/2021 | Zhang | H10B 12/482 |
| 2022/0165657 | A1* | 5/2022 | Park | H01L 23/528 |
| 2022/0406792 | A1* | 12/2022 | Yamaguchi | H10B 12/488 |

* cited by examiner

*Primary Examiner* — Mary A Wilczewski
*Assistant Examiner* — Jaesun Lee
(74) *Attorney, Agent, or Firm* — Winston Hsu (57) ABSTRACT

The invention discloses a semiconductor memory device, which is characterized by comprising a substrate defining a cell region and an adjacent periphery region, a plurality of bit lines are arranged on the substrate and arranged along a first direction, each bit line comprises a conductive part, and the bit line comprises four sidewalls, and a spacer surrounds the four sidewalls of the bit line, the spacer comprises two short spacers covering two ends of the conductive part, two long spacers covering the two long sides of the conductive part, and a plurality of storage node contact isolations located between any two adjacent bit lines, at least a part of the storage node contact isolations cover directly above the spacers. The structure of the invention can improve the electrical isolation effect, preferably avoid leakage current and improve the quality of components.

9 Claims, 7 Drawing Sheets

SEMICONDUCTOR MEMORY DEVICE

BACKGROUND OF THE INVENTION

1. Field of the Invention

The invention relates to a semiconductor device and a forming method thereof, in particular to a semiconductor memory device with storage node contact isolations with special arrangement.

2. Description of the Prior Art

With the trend of miniaturization of various electronic products, the design of dynamic random access memory (DRAM) cells must also meet the requirements of high integration and high density. For a DRAM cell with recessed gate structure, because it can obtain longer carrier channel length in the same semiconductor substrate to reduce the leakage of capacitor structure, it has gradually replaced the DRAM cell with only planar gate structure under the current mainstream development trend.

Generally, a DRAM cell with a recessed gate structure includes a transistor device and a charge storage device to receive voltage signals from bit lines and word lines. However, due to the limitation of process technology, the existing DRAM cells with recessed gate structure still have many defects, which need to be further improved to effectively improve the performance and reliability of related memory devices.

SUMMARY OF THE INVENTION

The invention provides a semiconductor memory device, which is characterized by comprising a substrate defining a cell region and an adjacent periphery region, wherein a plurality of bit lines are arranged on the substrate and arranged along a first direction, wherein each bit line comprises a conductive part, and the conductive part comprises four sidewalls, the four sidewalls comprises two ends and two long sides, and a spacer surrounds the four sidewalls of the bit line, the spacer comprises two short spacers covering two ends of the conductive part, and two long spacers covering the two long sides of the conductive part, and a plurality of storage node contact isolations located between any two adjacent bit lines, wherein at least a part of the storage node contact isolations is disposed above the spacers directly.

The feature of the invention is that when the storage node contact isolation is made, the storage node contact isolation will cover part of the spacer. In addition, a part of the storage node contact isolation also surrounds the end of the bit line. Therefore, the electrical isolation effect can be improved, leakage current is avoided, and the component quality is improved.

These and other objectives of the present invention will no doubt become obvious to those of ordinary skill in the art after reading the following detailed description of the preferred embodiment that is illustrated in the various figures and drawings.

DETAILED DESCRIPTION

In order to enable those familiar with the technical field of the present invention to have a better understanding of the present invention, several preferred embodiments of the present invention are listed below, and with the accompanying drawings, the composition and the desired effects of the present invention are described in detail.

Please refer to FIG. 1 to FIG. 5, which are top schematic views of a method for forming a semiconductor memory device according to a first preferred embodiment of the present invention.

Figure 1:
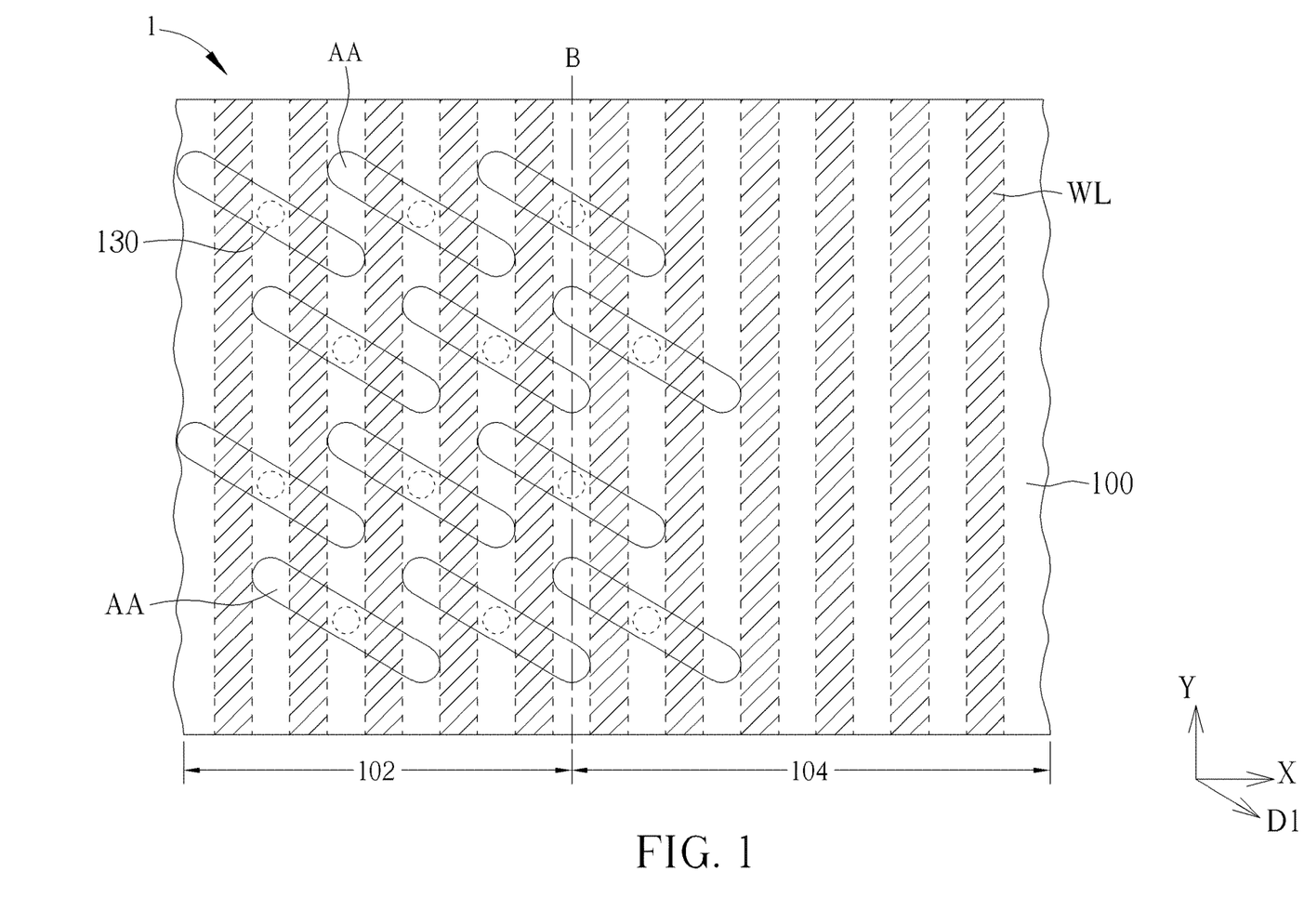
FIG. 1 to FIG. 5 are schematic top views of a method for forming a semiconductor memory device according to a first preferred embodiment of the present invention.

In this embodiment, a semiconductor memory device 1 is provided, for example, a dynamic random access memory, DRAM) including a recessed gate, which includes at least one transistor device (not shown) and at least one capacitor structure (not shown) as the smallest component unit in a DRAM array and receives voltage signals from word line (WL) and bit line (BL). First, as shown in FIG. 1, a semiconductor memory device 1 includes a cell region 102 and a periphery region 104 located next to the cell region 102. In some embodiments, the periphery region 104 surrounds the cell region 102. For the sake of brevity, only a part of the cell region 102 and a part of the periphery region 104 are depicted in FIG. 1. In addition, the boundary between the cell region 102 and the periphery region 104 is defined as the boundary B.

Specifically, the semiconductor memory device 1 includes a substrate 100, for example, a silicon substrate, a silicon-containing substrate (such as SiC, SiGe) or a silicon-on-insulator, SOI) substrate, etc. A plurality of active areas AA are defined in the cell region 102 of the substrate 100, and the active areas AA extend along an oblique direction D1 in parallel with each other at intervals and form a matrix. A plurality of buried gates are also formed in the substrate 100, for example, as a buried word line (BWL), which is called word line WL in this invention. The word lines WL, for example, extend parallel to each other along a vertical direction (e.g., Y direction), and span below the active areas AA (in the oblique direction D1), as shown in FIG. 1.

In an embodiment, the semiconductor memory device can be formed by the following steps, but is not limited to this. At first, at least one shallow trench isolation (STI), not shown) is formed in the substrate 100 to define each active region AA shown in FIG. 1 in the substrate 100. Then, a plurality of trenches (not shown) are formed on the substrate 100, and each trench is parallel to each other and extends toward the vertical direction (Y direction). In each trench, a dielectric layer covering the whole surface of the trench, a gate dielectric layer filling the lower half of the trench, a buried gate and an insulating layer filling the upper half of the trench are sequentially formed. The stacked structure of the above material layers forms a word line WL as shown in FIG. 1. As the fabrication method of the word line WL is a well-known technology in the field, it will not be described in detail here.

As shown in FIG. 1, an insulating layer (not shown) and a plurality of plug holes 130 are continuously formed on the surface of the substrate 100. The insulating layer comprises, for example, an oxide-nitride-oxide (ONO) structure to cover the substrate 100 and the word lines WL therein.

Figure 2:
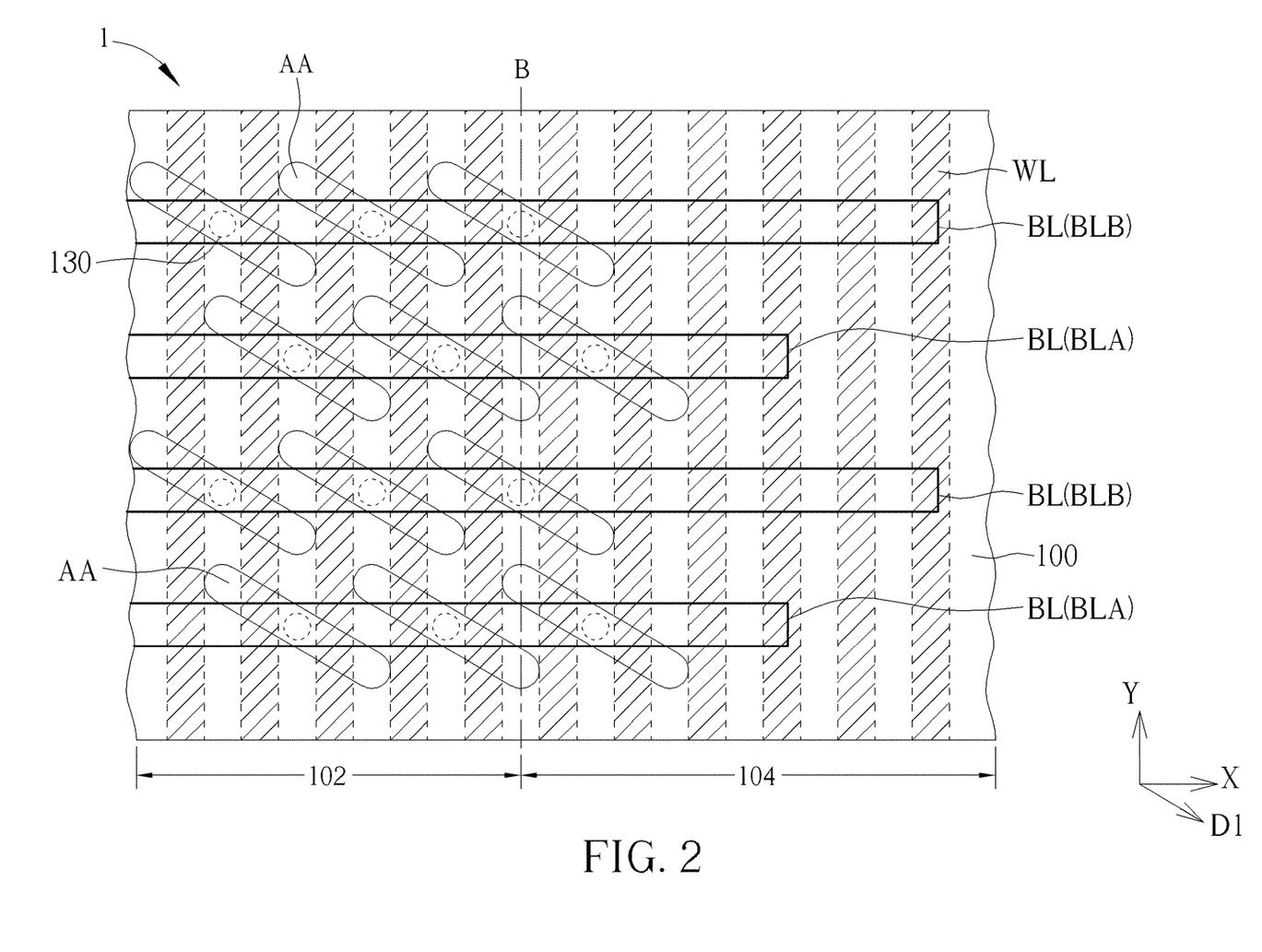

As shown in FIG. 2, a plurality of bit lines BL are formed on a substrate 100. In this embodiment, the bit line BL can be formed by a self-aligned double patterning (SADP) manufacturing process or a self-aligned reverse patterning (SARP) manufacturing process, but is not limited to this. In detail, a semiconductor layer (not shown, for example, a polysilicon layer) is formed on the substrate 100 to fill the plug hole 130 and further cover the substrate 100, and then a barrier layer (not shown, for example, including a titanium layer and/or a titanium nitride layer) and a metal layer (not shown, for example, a metal with low resistance such as tungsten, aluminum or copper) are sequentially formed on the semiconductor layer. Then, the self-aligned double patterning process or the self-aligned reverse patterning process is performed to pattern the semiconductor layer, the barrier layer, the metal layer and the shielding layer to form a plurality of bit lines BL on the substrate 100, which are arranged along a lateral direction (e.g., X direction).

In some embodiments of the present invention, according to actual use requirements, bit lines BL may have different extension lengths, and bit lines with different lengths are staggered. For example, in the periphery region 104, some bit lines BL are long and far away from the boundary between the cell region 102 and the periphery region 104 (defined as boundary B in FIG. 2), which can be defined as long bit lines BLB, while other bit lines are short and close to boundary B, which can be defined as short bit lines BLA. However, in other embodiments of the present invention, the bit lines BL may all have the same length and be aligned, which also falls within the scope of the present invention.

Figure 3:
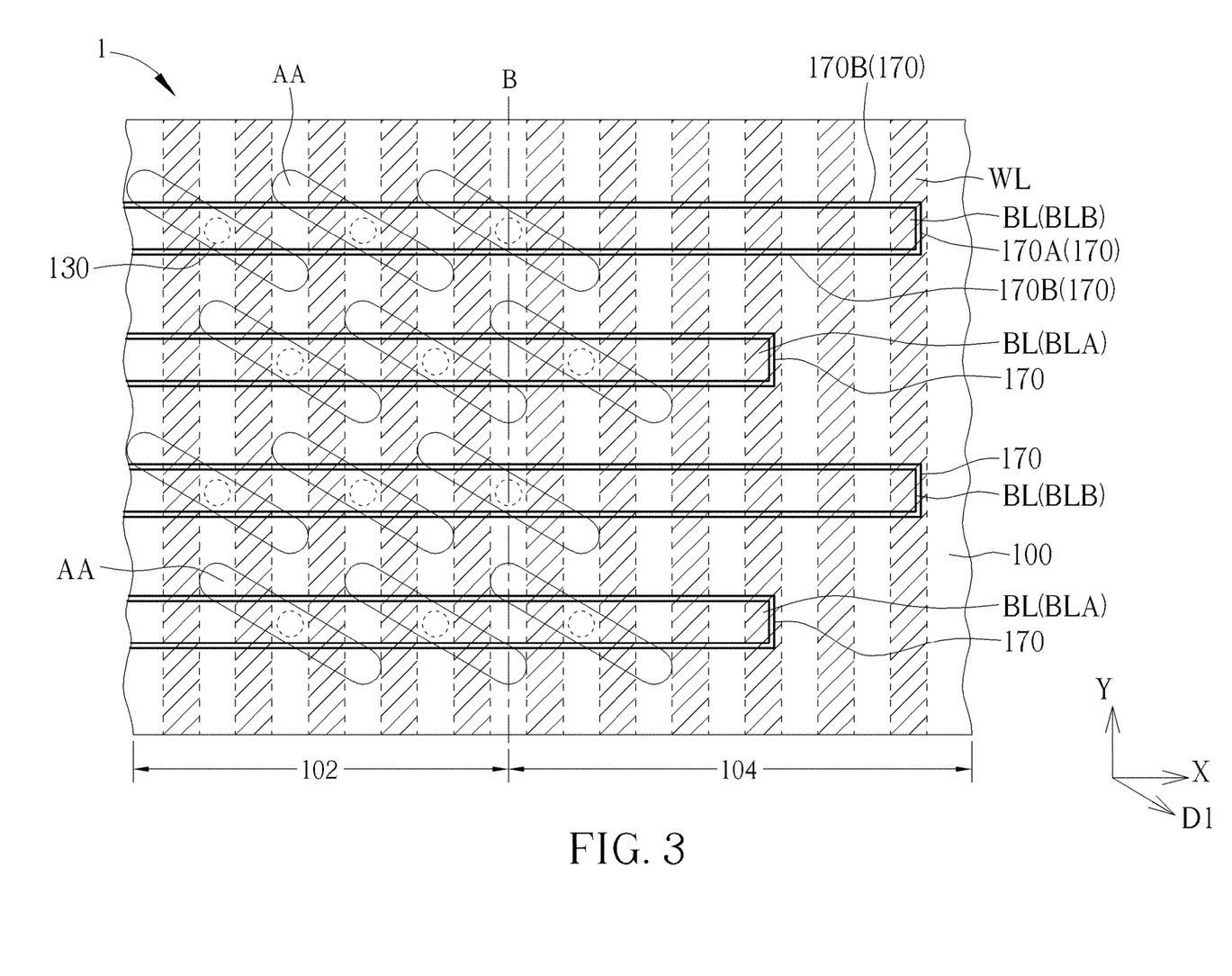

Then, as shown in FIG. 3, a spacer 170 is continuously formed on the sidewall of each bit line BL. In an embodiment, the spacer 170 may have a single layer structure, for example, containing the same dielectric material, such as silicon oxide, silicon nitride, silicon oxynitride, etc., or a composite layer structure, for example, including a first spacer and a second spacer formed in sequence, and the first spacer and the second spacer may contain different dielectric materials. In this embodiment, if the bit line is long and has four sidewalls (two long sides and two short sides/ends), the spacer 170 surrounds the four sides of the strip-shaped bit line BL. In FIG. 3, the spacer located at the end of the bit line BL is defined as a short spacer 170A, and the spacer located at the long side of the bit line BL is defined as a long spacer 170B.

Figure 4:
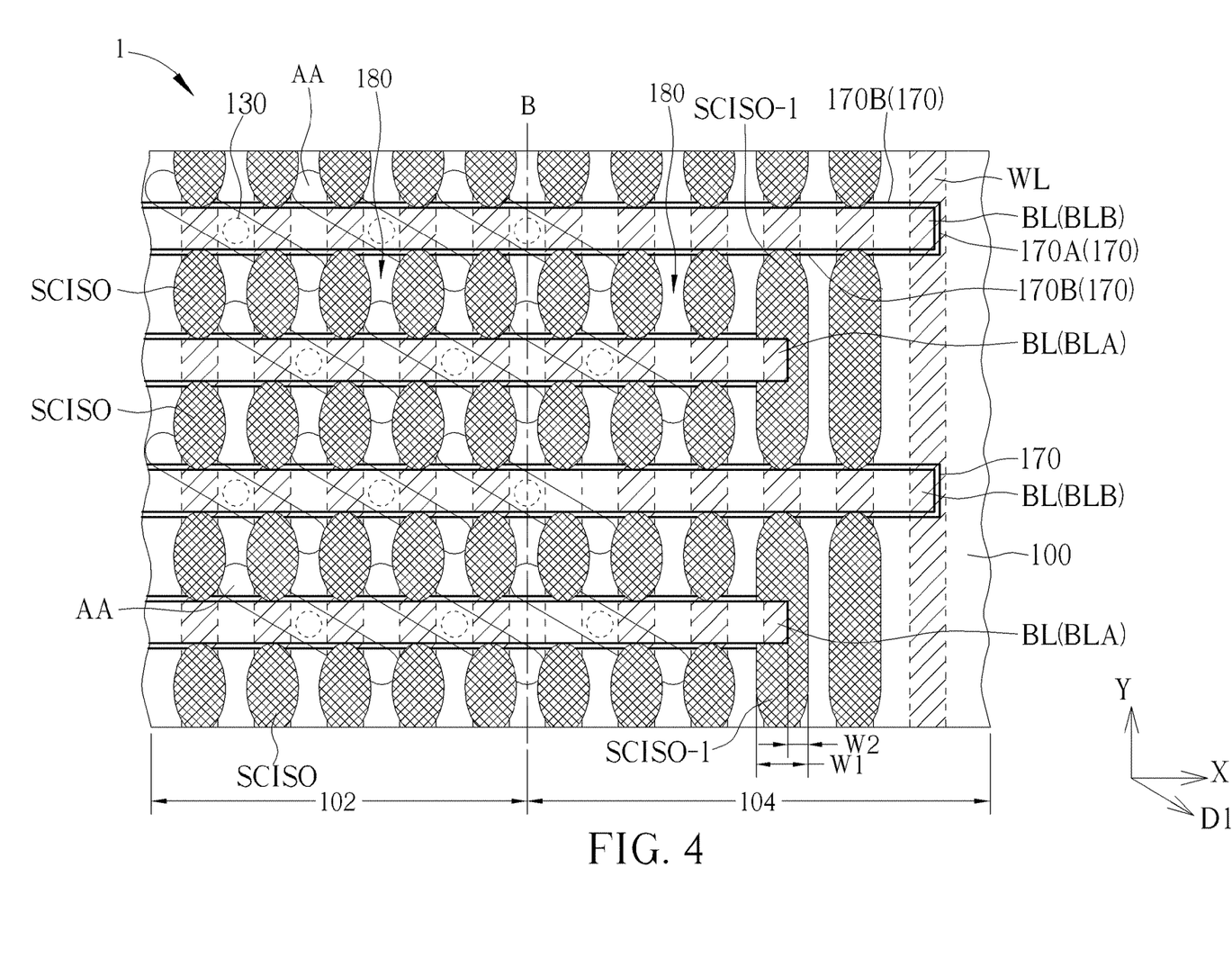

Then, as shown in FIG. 4, a storage node contact isolation SCISO is formed on the substrate 100. In this embodiment, the storage node contact isolation SCISO can also be formed by a self-aligned double patterning process in combination with a mold turnover process, but is not limited to this. In detail, a mould layer (not shown) is formed on the substrate 100 to fill the space between the bit lines BL. In an embodiment, the mould layer may comprise a suitable insulating material, such as silicon nitride, silicon oxide or silicon carbonitride, but is not limited thereto. Then, a patterning process and an etching process are performed on the mould layer, and a plurality of holes are formed in the mould layer. It is worth noting that the holes here correspond to the positions of the subsequent storage node contact isolations SCISO. Then, after filling the holes with another insulating layer (not shown) and removing the mould layer, the remaining insulating layer is the storage node contact isolation SCISO, as shown in FIG. 4. The insulating layer is, for example, silicon nitride, silicon oxide or silicon carbonitride. And since the storage node contact isolation SCISO is formed by filling the holes with insulating materials, from the top view, the storage node contact isolation SCISO may be rounded. It is worth noting that, in this embodiment, a part of the storage node contact isolation SCISO covers directly above the spacer 170. Therefore, from the top view, the storage node contact isolation SCISO may overlap with a part of the spacer 170, and the storage node contact isolation SCISO may directly contact the conductive part (e.g., metal layer) of the bit line BL.

Generally, after the storage node contact isolation SCISO is formed, the area between the adjacent bit line BL and the adjacent storage node contact isolation SCISO is defined as the storage node hole 180 (i.e., the area where the abovementioned mould layer is removed). The storage node hole 180 exposes both ends of the active area AA below, and in the following steps, the storage node hole 180 will be filled with conductive material to form storage node contact. In which the storage node contact is used to electrically connect the active area AA and the capacitor structure formed later. As these technologies are conventional technologies in the field, they will not be described in detail here.

Figure 5:
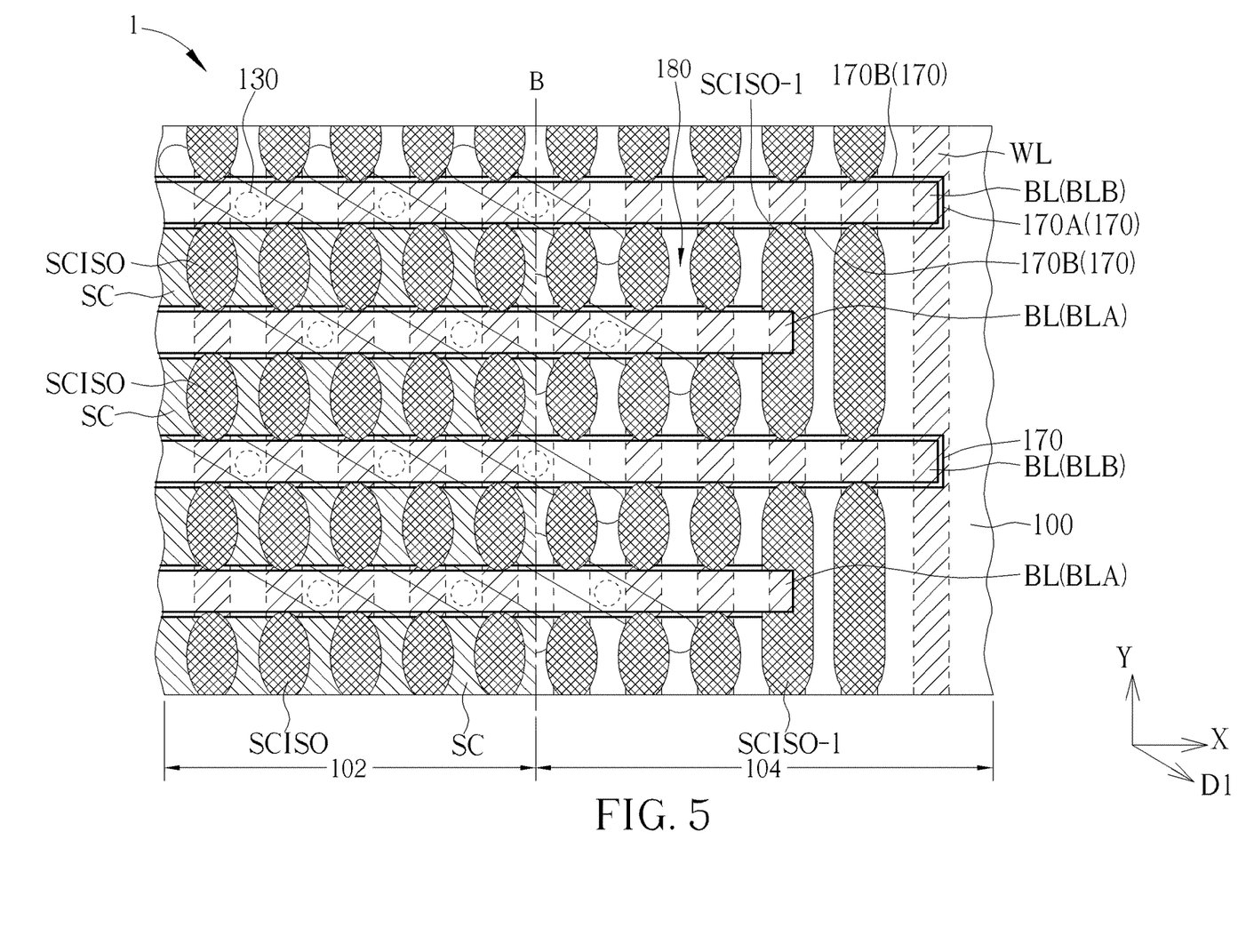

Then, as shown in FIG. 5, a conductive material (such as metal) is filled into the storage node hole 180 to form a plurality of storage node contacts SC. It is worth noting that most of the storage node holes in the cell region 102 are filled with conductive materials to form storage node contacts SC, while most of the storage node holes 180 in the periphery region 104 are not filled with conductive materials. As for a part of the storage node hole 180 near the boundary B between the cell region 102 and the periphery region 104, a part of the conductive material may be filled, but the storage node hole 180 is not filled up.

Figure 6:
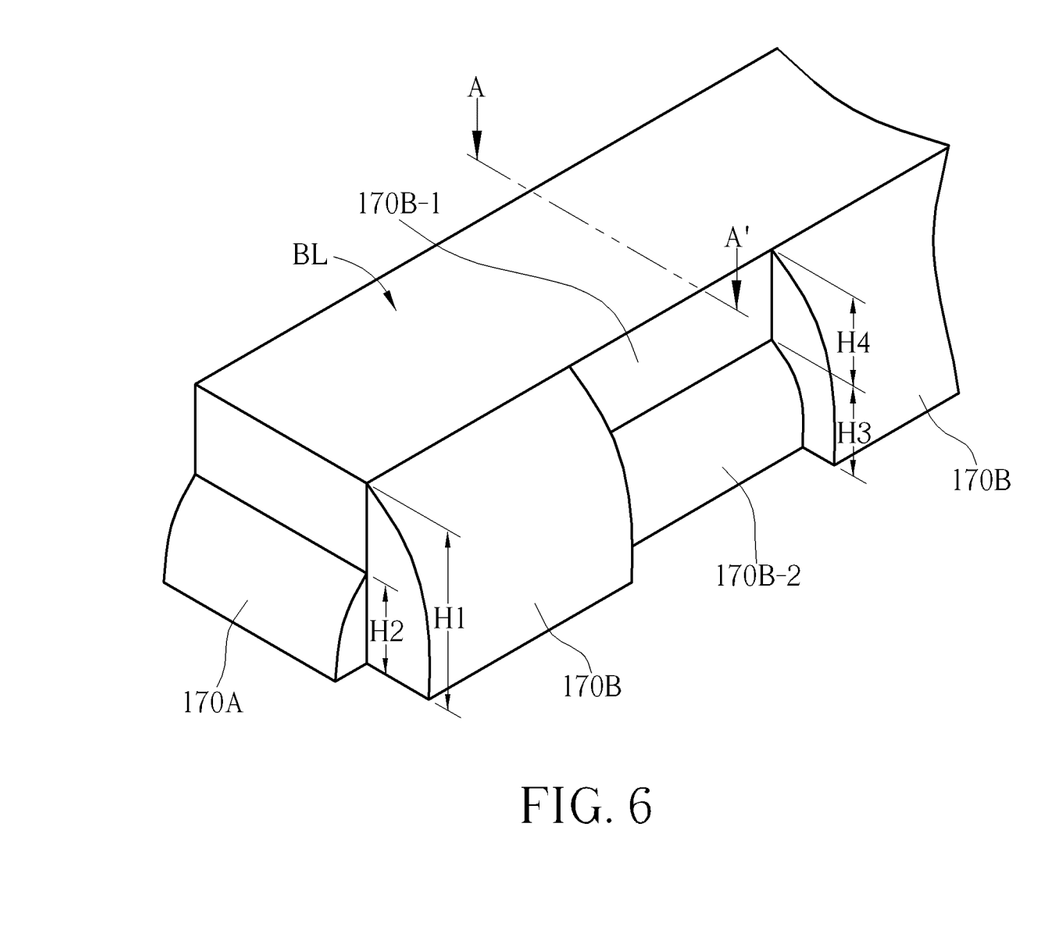
FIG. 6 is a partial schematic diagram of a bit line and a spacer.

In this embodiment, when the hole in the mould layer is formed by etching, the height of the spacer 170 may also be etched and reduced. Therefore, in this case, the storage node contact isolation SCISO may be formed just above the spacer 170. However, it is worth noting that the height of the spacer 170 will not decrease in the area covered by the mould layer (that is, the area where the storage node contacts SC). Therefore, for the same bit line BL, the spacer 170 has a lower height (corresponding to the storage node contact isolation SCISO) and a higher height (corresponding to the storage node contacts SC). FIG. 6 shows a partial schematic diagram of a bit line and a spacer.

Figure 7:
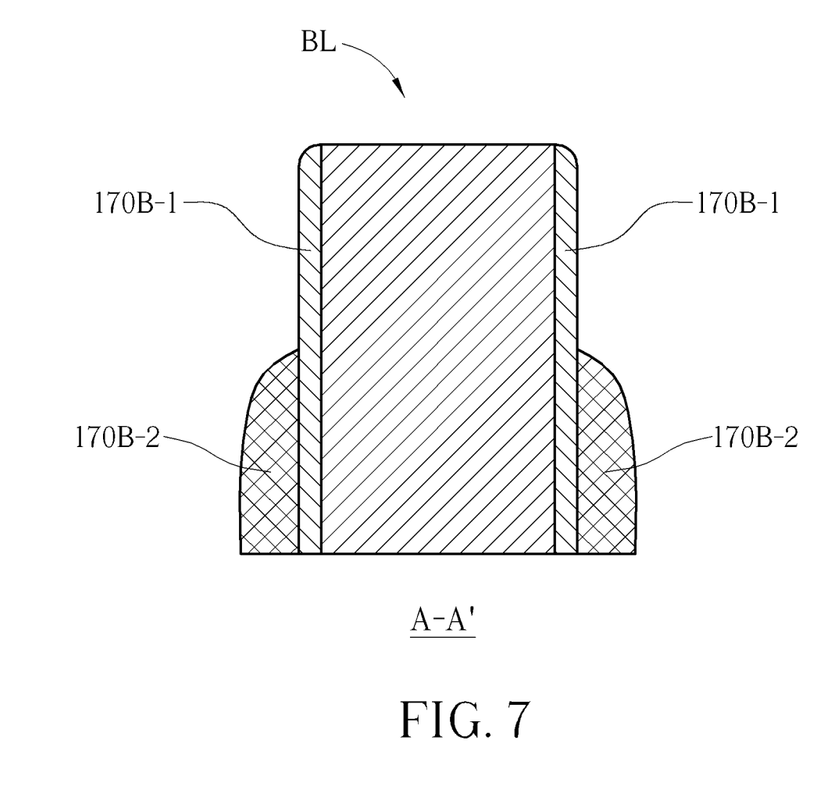
FIG. 7 is a partial cross-sectional schematic diagram of bit lines and spacers.

In FIG. 6, some heights H1, H2, H3 and H4 are also marked, where H1 is the height of bit line, H2 is the height of short spacer at the end of bit line, H3 is the height of longer spacer at the side of bit line, and H4 is the height of bit line minus H3. In addition, in FIG. 6, the long spacer 170B includes two parts, namely, a first long spacer 170B-1 with a higher height and close to the bit line BL, and a second long spacer 170B-2 which covers the first long spacer and is formed later and has a lower height. As the long spacer includes the first long spacer 170B-1 and the second long spacer 170B-2 formed at different time points and covering different positions, from the cross-sectional view (refer to FIG. 7), the width of the lower half of the bit line BL including the spacer will be wider (because it is covered with two layers of spacers), while the width of the upper half of BL including the spacer will be narrower (because less spacers are covered or part of the spacers are etched).

Thereafter, other components, such as electronic components such as capacitor structures, may be formed to complete the semiconductor memory device described in this embodiment.

With reference to FIG. 4 and FIG. 5, in the process of forming the storage node contact isolation SCISO, a part of the spacer 170 will also be removed, resulting in a decrease in the height of the spacer 170. Then, the formed storage node contact isolation SCISO is formed just above the partial spacer 170. In the prior art, the storage node contact isolation SCISO is usually located at the side of the spacer, but not directly above the spacer. Compared with the prior art, the applicant found that the storage node contact isolation SCISO is located directly above part of the spacer 170 and closer to the body of the bit line BL, which can fill the space for the spacer to descend, enhance the isolation effect of the storage node hole 180, avoid the leakage current generated by the formed storage node contact SC, and improve the quality of the component.

On the other hand, a part of the storage node contact isolation SCISO covers the short spacer 170A near the end portion of the short bit line BLA, so that the end of the short bit line BLA can be preferably protected to avoid current flowing out from the end of the short bit line BLA. These storage node contact isolations (defined as storage node contact isolation SCISO-1 in FIG. 4 and FIG. 5) located near the end portion of the short bit line BLA are slightly different from other storage node contact isolations SCISO in shape. More specifically, the center portion (that is, the portion aligned with the short spacer 170A in the lateral direction) has a narrower width, while the upper and lower end portions have a wider width. In this way, the spacers (one short spacer 170A and two long spacers 170B) beside the three different sidewalls at the end of the short bit line BLA can be covered, so as to achieve a better protection effect.

According to the above description and drawings, the present invention provides a semiconductor memory device, which is characterized by comprising a substrate defining a cell region 102 and an adjacent periphery region 104, a plurality of bit lines BL arranged on the substrate 100 and arranged along a first direction, wherein each bit line BL comprises a conductive part, and the bit line comprises four sidewalls, and a spacer 170 surrounds the four sidewalls of the bit line. In which the spacer 170 includes two short spacers 170A covering two ends of the conductive part, two long spacers 170B covering two long sides of the conductive part, and a plurality of storage node contact isolations SCISO located between any two adjacent bit lines BL, wherein at least a part of the storage node contact isolations SCISO is disposed above the spacer 170 directly.

In some embodiments, the long spacer 170B further comprises a first long spacer 170B-1 and a second long spacer 170B-2, the second long spacer 170B-2 covers the outer side of the first long spacer 170B-1, and the height of the first long spacer 170B-1 is greater than that of the second long spacer 170B-2.

In some embodiments, the height of the short spacer 170A is larger than that of the second long spacer 170B-2, but the height of the short spacer 170A is smaller than that of the first long spacer 170B-1.

In some embodiments, which are located in the periphery region 104, at least one storage node contact isolation SCISO is included to contact at least one short spacer 170A.

In certain embodiments, the storage node contact isolation SCISO contacting the short spacer 170A also contacts a part of the two long spacers 170B at the same time.

In some embodiments, the short spacer 170A is located between two long spacers 170B, and a depth of the storage node contact isolation SCISO contacting the short spacer 170A is greater than a depth of the storage node contact isolation SCISO contacting the long spacer 170B.

In some embodiments, the storage node contact isolation SCISO contacting the short spacer 170A includes a central portion with a smaller width and two end portions with a larger width.

In some embodiments, the central portion in which the width is smaller is aligned with the bit line BL in the first direction (lateral direction).

In some embodiments, the area between two adjacent bit lines BL and two adjacent storage node contact isolations SCISO is defined as a storage node hole 180, in which the cell region 102 contains a conductive layer to fill each storage node hole 180, and the conductive layer in the storage hole is defined as a plurality of storage node contacts SC, and most of the storage node hole 180 in the periphery region 104 does not contain a conductive layer.

In some embodiments, the multiple bit lines include at least one long bit line BLB and at least one short bit line BLA, wherein the long bit line BLB and the short bit line BLA have different extension lengths, and a top surface (H2) of the short spacer near one end of the long bit line BLB is higher than a top surface (H2) of the short spacer near one end of the short bit line BLA.

In some embodiments, at a boundary B between the periphery region 104 and the cell region 102, the storage node hole 180 is only filled with a part of the conductive layer, but not filled up with the conductive layer.

In some embodiments, a plurality of bit lines BL include at least one long bit line BLB and at least one short bit line BLA, wherein the long bit line BLB and the short bit line BLA have different extension lengths, and a top surface of the short spacer 170A near one end of the long bit line BLB is higher than a top surface of the short spacer 170A near one end of the short bit line BLA.

In some embodiments, a top surface height of the long spacer 170B or the short spacer 170A is smaller than a top surface height of the conductive part of the bit line BL.

To sum up, the present invention is characterized in that when the storage node contact isolation is manufactured, the storage node contact isolation will cover part of the spacer. In addition, a part of the storage node contact isolation also surrounds the end of the bit line. Therefore, the electrical isolation effect can be improved, leakage current is preferably avoided, and the component quality is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor memory device, comprising:
   a substrate;
   a plurality of bit lines arranged on the substrate and arranged along a first direction, wherein each bit line comprises a conductive part and the conductive part comprises four sidewalls, wherein the four sidewalls comprises two ends and two long sides;
   a spacer covers parts of the four sidewalls of the bit line, wherein the spacer includes two short spacers covering the two ends of the conductive part and two long spacers covering the two long sides of the conductive part; and
   a plurality of storage node contact isolations (SCISOs) located between any two adjacent bit lines, wherein at least one storage node contact isolation contacts and covers at least one of the short spacers of the bit lines.

2. The semiconductor memory device according to claim 1, wherein the long spacer further comprises a first long spacer and a second long spacer, the second long spacer covers the outer side of the first long spacer, and wherein the height of the first long spacer is higher than the height of the second long spacer.

3. The semiconductor memory device according to claim 2, wherein the height of the short spacer is higher than the height of the second long spacer, but the height of the short spacer is lower than the height of the first long spacer.

4. The semiconductor memory device according to claim 1, wherein the storage node contact isolation contacting the short spacer also simultaneously contacts a part of the two long spacers.

5. A semiconductor memory device, comprising:
a substrate;
a plurality of bit lines arranged on the substrate and arranged along a first direction, wherein each bit line comprises a conductive part and the conductive part comprises four sidewalls, wherein the four sidewalls comprises two ends and two long sides, wherein the plurality of bit lines comprise at least one long bit line and at least one short bit line, wherein the long bit line and the short bit line have different extension lengths, and a top surface of the short spacer near one end of the long bit line is higher than a top surface of the short spacer near one end of the short bit line;
a spacer covers parts of the four sidewalls of the bit line, wherein the spacer includes two short spacers covering the two ends of the conductive part and two long spacers covering the two long sides of the conductive part; and
a plurality of storage node contact isolations (SCISOs) located between any two adjacent bit lines.

6. The semiconductor memory device according to claim 5, wherein the long spacer further comprises a first long spacer and a second long spacer, the second long spacer covers the outer side of the first long spacer, and wherein the height of the first long spacer is higher than the height of the second long spacer.

7. The semiconductor memory device according to claim 5, wherein a cell region and an adjacent periphery region are defined on the substrate, wherein the area between two adjacent bit lines and two adjacent storage node contact isolations is further defined as a storage hole, wherein the cell region contains a conductive layer to fill each storage hole, and the conductive layer in the storage hole is defined as a plurality of storage node contacts, and parts of the storage hole in the periphery region does not contain the conductive layer.

8. The semiconductor memory device according to claim 7, wherein at a boundary between the periphery region and the cell region, the storage hole is only filled with a part of the conductive layer, but not filled up with the conductive layer.

9. The semiconductor memory device according to claim 5, wherein a top surface height of the short spacer is smaller than a top surface height of the conductive part of the bit line.

\* \* \* \* \*